United States Patent
Gori et al.

(10) Patent No.: US 9,240,514 B2
(45) Date of Patent: Jan. 19, 2016

(54) PHOTOVOLTAIC CELL HAVING A HIGH CONVERSION EFFICIENCY

(75) Inventors: Gabriele Gori, Seriate (IT); Roberta Campesato, Cologno Monzese (IT)

(73) Assignee: CESI—CENTRO ELETTROTECNICO SPERIMENTALE ITALIANO GIACINTO MOTTA S.P.A., Milan (IT)

( * ) Notice: Subject to any disclaimer, the term of this patent is extended or adjusted under 35 U.S.C. 154(b) by 1033 days.

(21) Appl. No.: 13/119,383

(22) PCT Filed: Jul. 20, 2010

(86) PCT No.: PCT/EP2010/060477
§ 371 (c)(1),
(2), (4) Date: Mar. 20, 2012

(87) PCT Pub. No.: WO2011/009857
PCT Pub. Date: Jan. 27, 2011

(65) Prior Publication Data
US 2012/0167967 A1     Jul. 5, 2012

(30) Foreign Application Priority Data
Jul. 21, 2009 (IT) .............................. MI2009A1285

(51) Int. Cl.
*H01L 31/0352* (2006.01)
*H01L 31/18* (2006.01)
*H01L 31/0725* (2012.01)

(52) U.S. Cl.
CPC ............ *H01L 31/18* (2013.01); *H01L 31/0725* (2013.01); *Y02E 10/50* (2013.01)

(58) Field of Classification Search
CPC ....... H01L 31/00; H01L 31/04; H01L 31/047; H01L 31/065; H01L 31/068; H01L 31/0687; H01L 31/0735; H01L 31/02; H01L 31/0248; H01L 31/0352; H01L 31/028
See application file for complete search history.

(56) References Cited

U.S. PATENT DOCUMENTS

| 2009/0078310 A1* | 3/2009 | Stan et al. ........... 136/255 |
| 2009/0155952 A1 | 6/2009 | Stan et al. |

FOREIGN PATENT DOCUMENTS

CN           101459204           6/2009

OTHER PUBLICATIONS

Quartic polynomial function retrieved from http://www.sscc.edu/home/jdavidso/Math/Catalog/Polynomials/Fourth/FourthDegree5.html on May 5, 2015.*

(Continued)

*Primary Examiner* — Christina Chern
(74) *Attorney, Agent, or Firm* — Bryan A. Santarelli; Lane Powell PC

(57) ABSTRACT

An embodiment of a monolithic photovoltaic cell is provided. The photovoltaic cell comprises at least one junction; said at least one junction includes a base formed by an epitaxial doped semiconductor material of a first conductivity type and an emitter formed by a doped semiconductor material of a second conductivity type opposed to the first. Said emitter is stacked on the base according to a first direction, and the base of at least one of said at least one junction has a decreasing dopant concentration gradient along said first direction. Said base comprises a first portion far from the emitter, a second portion proximate to the emitter, and a third portion between the first portion and the second portion. In the first portion, said decreasing dopant concentration gradient has a slope whose average value ranges from approximately $-9*10^{17}$ $cm^{-3}/\mu m$ to $-4*10^{17}$ $cm^{-3}/\mu m$. In the second portion, said decreasing dopant concentration gradient has a slope whose average value ranges from approximately $-3*10^{17}$ $cm^{-3}/\mu m$ to $-9*10^{16}$ $cm^{-3}/\mu m$. In the third portion, said decreasing dopant concentration gradient has a slope whose average value ranges approximately from $-2*10^{17}$ $cm^{-3}/\mu m$ to $-5*10^{16}$ $cm^{-3}/\mu m$.

9 Claims, 3 Drawing Sheets

(56) References Cited

OTHER PUBLICATIONS

Harold J. Hovel, "Semiconductors and Semimetals", Solar Cells, vol. 11, Thomas J. Watson Research Center IBM Corporation, 1975 Academic Press New York, San Francisco, London, pp. 4.

K.J. Weber, A. Cuevas, A.W. Blakers, "The influence of drift fields in thin silicon solar cells", Solar Energy Materials and Solar Cells, vol. 45, No. 2, Jan. 15, 1997, pp. 151-160.

L. A. Verhoef, FJ. Bisschop, and W. C. Sinke, "Analytical Solution of Minority-Carrier Transport In Silicon Solar Cell Emitters", FOM-Institute for Atomic and Molecular Physics, Kruislaan 407, 1098 SJ Amsterdam, The Netherlands, IEEE, Sep. 26, 1998, pp. 738-743.

International Search Report for International Application No. PCT/EP2010/060477, European Patent Office, Aug. 31, 2010, pp. 4.

* cited by examiner

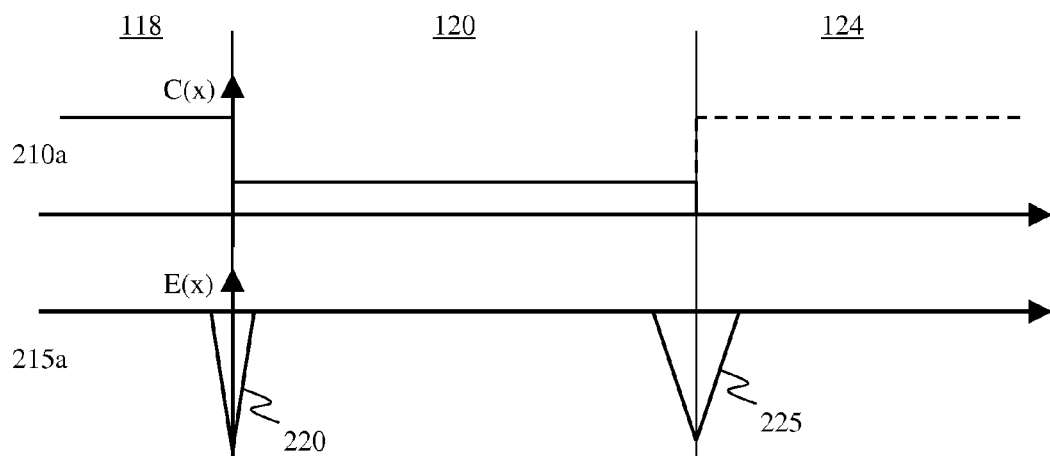
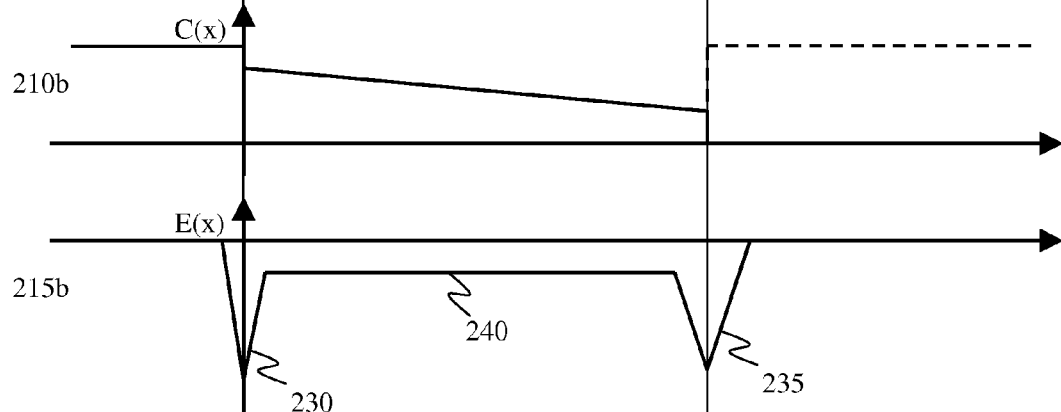
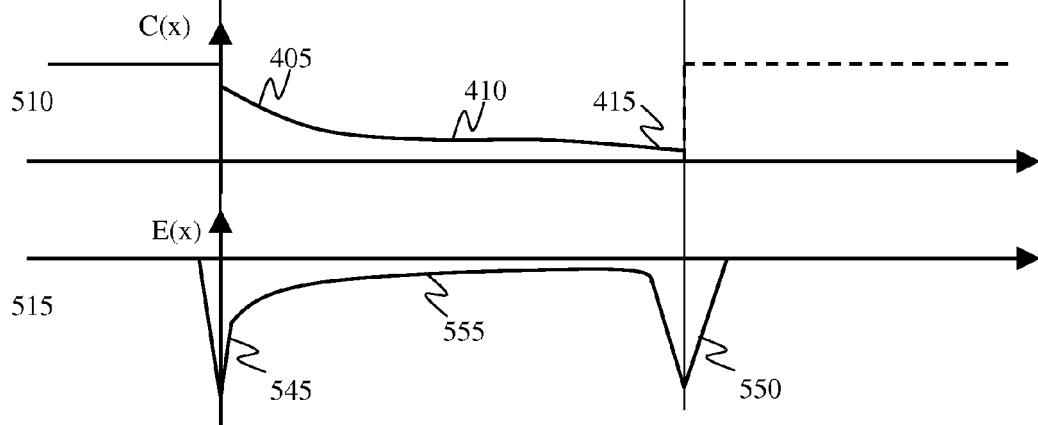

PHOTOVOLTAIC CELL HAVING A HIGH CONVERSION EFFICIENCY

PRIORITY CLAIM

The present application is a national phase application filed pursuant to 35 USC §371 of International Patent Application Serial No. PCT/EP2010/060477, filed Jul. 20, 2010; which further claims the benefit of Italian Patent Application MI2009A001285, filed Jul. 21, 2009; all of the foregoing applications are incorporated herein by reference in their entireties.

TECHNICAL FIELD

An embodiment generally relates to a photovoltaic cell, and particularly a photovoltaic cell for solar radiation (solar cell).

BACKGROUND

Solar cells are electronic devices capable of converting electromagnetic energy—such as the solar radiation—into electricity.

Such electronic devices are mainly comprised of semiconductor materials, which are characterized by solid crystalline structures having forbidden energy bands ("band gaps") located between the valence bands and the conduction bands. A band gap defines an energy interval which is normally unavailable to free electrons. However, when solar radiation hits a material of such type in a solar cell, the electrons that occupy lower energy bands may be excited to the point of making an energetic jump and exceeding the band gap, for reaching higher energy bands. For example, when electrons in the valence bands of a semiconductor absorb sufficient energy from the photons of the incident solar radiation, such electrons may exceed the band gap and reach the conduction band.

Reaching the higher energy bands, such electrons leave empty locations within the lower energy bands; such empty locations, often referred to as "holes", may move from atom to atom in the crystalline reticule. The holes act thus as charge carriers, in the same way as the free electrons in the conduction band, and contribute to the conductivity of the crystal.

In other words, each photon absorbed by the semiconductor generates a corresponding hole-electron pair. The set of electron-hole pairs formed by the photons absorption generates the so-called photocurrent of the solar cell. The holes and the electrons generated in this way may recombine with each others, subtracting their contribution to the maintenance of the photocurrent. In order to avoid (or at least to reduce as much as possible) this phenomenon for increasing the efficiency of the solar cell, a local electric field is generated within the semiconductor material. In this way, the holes and the electrons generated further to the absorption of the photons are accelerated by the local electric field toward opposite directions, and thus the probability that they will recombine before reaching the terminals of the solar cell drastically diminishes. Particularly, such electric field may be generated by means of the generation of a spatial charge region, such as the depletion region obtainable by means of a pn junction between a pair of oppositely doped semiconductor materials.

Such solar cells, generally used for space and terrestrial applications, may be of the single pn or np junction-type, or single-junction solar cells, or may be of the more-than-one pn or np junction-type, or multi-junction solar cells.

Single-junction solar cells are substantially constituted by the presence of a single pn or np junction. Conversely, multi-junction solar cells are implemented by stacking various pn or np junctions, presently from two to five junctions. The different junctions are made in different semiconductor materials, and are electrically coupled to each other in series by means of tunnel diodes interposed between each pair of adjacent junctions.

Each of the different superimposed junctions forms a so-called elementary cell, and the various elementary cells are capable of singularly converting the various portions of the incident solar radiation spectrum in a more efficient way compared to the one obtainable with a single junction.

Multi-junction cells may have the advantage of being capable of providing a higher output voltage with respect to single-junction cells, the overall voltage being equal to the sum of the voltages of the single elementary cells (minus a little voltage drop in the tunnel diodes serially coupling the cells).

In order to be manufactured, the various material layers directed to form the different junctions are typically obtained with an epitaxial growth technique through deposition (for example by means of the Metal Organic Chemical Vapor Deposition technique, or MOCVD) on commercial germanium (Ge), silicon (Si), or gallium arsenide (GaAs) substrates.

During the last few years, the performances of solar cells based on compounds of elements of Groups III and V of the periodic table of the elements, i.e. based on the III-V compounds, and in particular of GaAs solar cells, have been increasing, thanks to the progress of technologies that allow developing new materials for manufacturing three, four, and also five junction cells.

The cost of a multi-junction solar cell is slightly higher than the cost of a single-junction one, and its efficiency is significantly higher (in a condition of out-of-terrestrial-atmosphere illumination at 25° C., the efficiency is approximately equal to 28% for a triple-junction cell, compared to 20% for a single-junction one); for this reason, especially for aerospace applications, the market is oriented toward the use of these new, more efficient, devices. For example, the present big telecommunication satellites may require the use of triple-junction solar cells. These cells have, on the other hand, an employ in terrestrial applications, such as in optical concentration systems.

As already mentioned above, the efficiency of a solar cell strictly depends on the recombination phenomenon of the photo-generated hole-electron pairs. The hole-electron pairs generated outside of the depletion region may not be subjected to the action of any electric field, and thus may have a high probability of recombining, subtracting their contributions from the photo-generated current.

In order to improve the efficiency of a solar cell, a known technique provides for increasing the depth of the depletion region (and, thus, increasing the portion of the semiconductor material that is subjected to the electric field) by inserting a portion of an intrinsic (i.e., that is not doped) semiconductor material between the n-doped portion and the p-doped portion. This technique generally increases the efficiency of the solar cell, until the thickness of the depletion region reaches a value such as to limit the output voltage. Beyond this value, the efficiency of the device starts to diminish.

According to another technique, the semiconductor material portions of the solar cell that do not belong to the depletion layer may be subjected to local electric fields obtained by means of the use of proper doping gradients. Particularly, in "*Semiconductors and Semimetals*, Vol. II", by Harold J.

Hovel, the semiconductor portion of the p type is doped according to a linear doping gradient. Thanks to the presence of the linear doping gradient, the semiconductor material portion of the p type may be subjected to a constant electric field capable of accelerating the hole-electron pairs that are generated therein but outside of the depletion region.

SUMMARY

In view of the above, it has been observed that known techniques regarding the implementation of photovoltaic cells, and particularly the implementation of solar cells, may be improved from the efficiency point of view.

An embodiment regards a monolithic photovoltaic cell. Such cell comprises at least one junction; said at least one junction includes a base formed by an epitaxial doped semiconductor material of a first conductivity type and an emitter formed by a doped semiconductor material of a second conductivity type opposed to the first. The emitter is stacked on the base according to a first direction, and the base of at least one of said at least one junction has a decreasing dopant concentration gradient along said first direction. Said base comprises a first portion far from the emitter, a second portion proximate to the emitter, and a third portion between the first portion and the second portion. In the first portion, the decreasing dopant concentration gradient has a slope whose average value substantially ranges from $-9*10^{17}$ cm$^{-3}$/μm to $-4*10^{17}$ cm$^{-3}$/μm. In the second portion, said decreasing dopant concentration gradient has a slope whose average value substantially ranges from $-3*10^{17}$ cm$^{-3}$/μm to $-9*10^{16}$ cm$^{-3}$/μm. In the third portion, said decreasing dopant concentration gradient has a slope whose average value substantially ranges from $-2*10^{17}$ cm$^{-3}$/μm to $-5*10^{16}$ cm$^{-3}$/μm.

A further embodiment regards a corresponding method for manufacturing a photovoltaic cell.

BRIEF DESCRIPTION OF THE DRAWINGS

One or more embodiments, as well as further features and advantages thereof, are best understood by reference to the following detailed description, to be read in conjunction with the accompanying drawings: in this regard, it is expressly intended that the figures are not necessarily drawn to scale and that, unless otherwise indicated, they are simply intended to be conceptually illustrative of the described structures and procedures. Particularly:

FIG. 2 illustrates the doping profiles of a junction of the cell of FIG. 1 and the corresponding electric field according to a first conventional technique;

FIG. 3 illustrates the doping profiles of a junction of the cell of FIG. 1 and the corresponding electric field according to a second conventional technique;

FIG. 5 illustrates the doping profiles of a junction of the cell of FIG. 1 and the corresponding electric field according to an embodiment.

DETAILED DESCRIPTION

Figure 1:
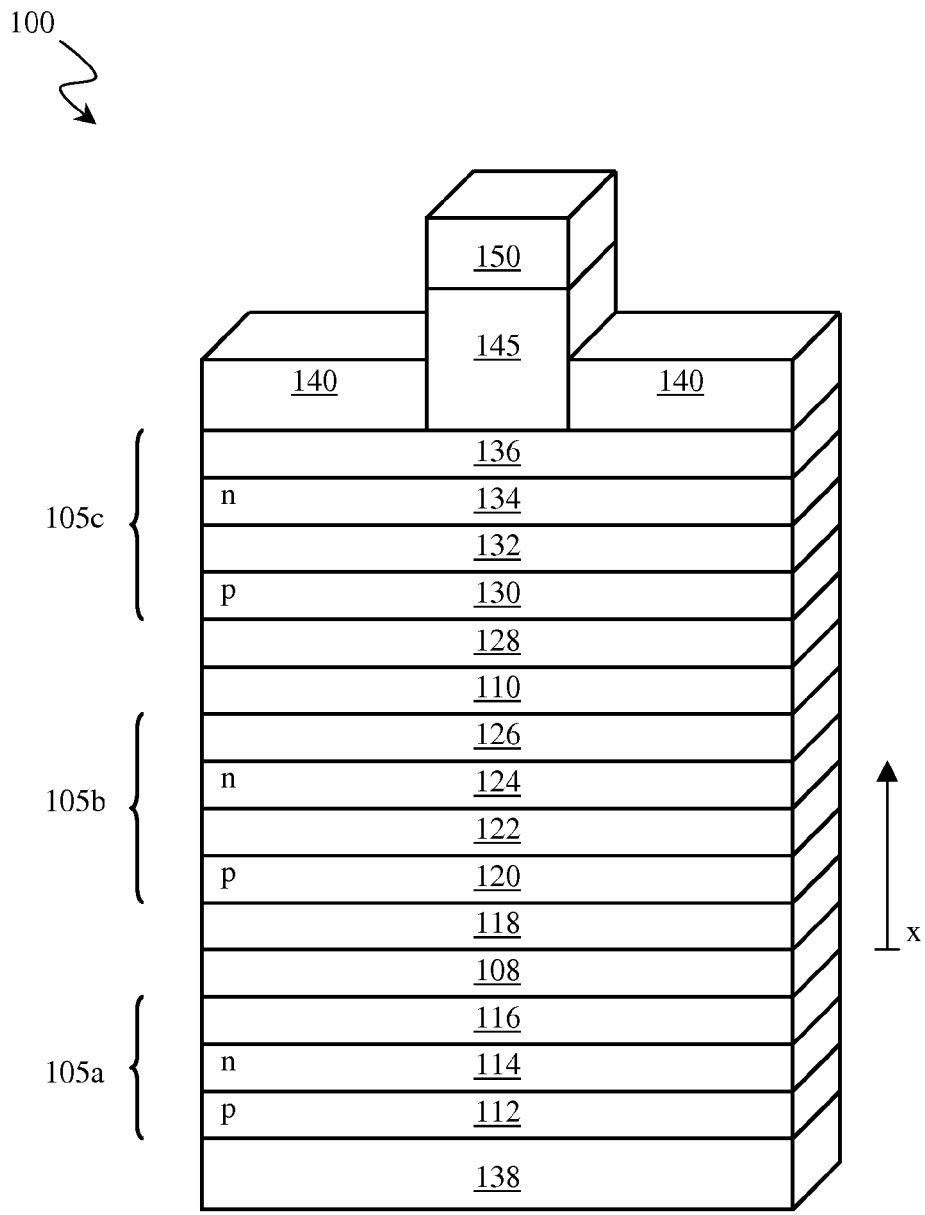
FIG. 1 shows a vertical sectional view of a monolithic photovoltaic cell.

With reference to the drawings, and particularly to FIG. 1, it is schematically shown a vertical section of a monolithic photovoltaic cell, particularly but not imitatively, a solar cell, wherein the concepts according to an embodiment may be applied. The photovoltaic cell, globally identified with the reference 100, is a multi-junction cell having three junctions, and comprises a first elementary cell, indicated in figure with the reference 105a and denoted "lower" cell, a second elementary cell, indicated in figure with the reference 105b and denoted "intermediate" cell, and a third elementary cell, indicated in the figure with the reference 105c and denoted "higher" cell. The higher cell 105c is located above the intermediate cell 105b, which is in turn located above the lower cell 105a.

The three elementary cells are electrically coupled to each other in series, interposed with tunnel diodes; particularly, the lower cell 105a is electrically coupled to the intermediate cell 105b by means of a first tunnel diode, identified in figure with the reference 108, while the intermediate cell 105b is electrically coupled to the higher cell 105c by means of a second tunnel diode, identified in figure with the reference 110.

The lower cell 105a comprises a first semiconductor material layer 112 (denoted "base") of a first conductivity type, for example of the p type, and a second semiconductor material layer 114 (denoted "emitter") of the opposite conductivity type, for example of the n type. The base 112 and the emitter 114 are located in direct contact with each other, for the purpose of forming a pn junction. A further semiconductor material 116, denoted "window layer," may be formed above the emitter 114.

The tunnel diode 108 is formed above the window layer 116.

Between the tunnel diode 108 and the intermediate cell 105b a barrier layer 118 may be placed for reducing the superficial recombination effect of the charge carriers photo generated in the layer 120, increasing thus the conversion efficiency of the photovoltaic cell 100.

The intermediate cell 105b, formed above the barrier layer 118, comprises a first semiconductor layer 120 (base) of the first conductivity type, for example of the p type; above the base 120, a second layer 122 is formed, denoted "spacer layer" and constituted by an intentionally non-doped semiconductor material. The intermediate cell 150b further comprises a third semiconductor material layer 124 (emitter) located above the spacer layer 122. The emitter 124 is comprised of a semiconductor material of the conductivity type opposed to the one of the base 120, for example of the n type. In the same way as for the lower cell 105a, a window layer 126 may be formed above the emitter 124 of the intermediate cell 105b.

The tunnel diode 110 is formed above the window layer 126. A further barrier layer 128 may be placed between the tunnel diode 110 and the higher cell 105c.

The higher cell 105c, formed above the barrier layer 128, comprises a first semiconductor material layer 130 (base) of the first conductivity type, for example of the p type; a spacer layer 132 constituted by an intentionally non-doped semiconductor material is formed above the base 130. A third semiconductor material layer 134 (emitter) of the conductivity type opposed to the one of the base 130, for example of the n type, is formed above the spacer layer 132. A window layer 136 may be formed above the emitter 134.

A first conductive material layer 138, for example a metal such as gold (Au) or silver (Ag), is formed on the back of the photovoltaic cell 100, and particularly in the proximity of the surface of the base 112 opposed to the one facing the emitter 114, constituting a first contact terminal of the photovoltaic cell 100.

A cap 145 of a semiconductor material of a prescribed conductivity type, for example of the n type, is piecewise formed above the window layer 136 corresponding to the higher cell 105c; a contact 150 of a conductive material, for example a metal such as Au or Ag, is formed above the cap 145, constituting a second contact terminal of the photovoltaic cell 100.

Above the window layer 136 is further formed a covering layer 140 made of a anti-reflection material, for example constituted by one or more oxide layers. A proper passage via is left within the anti-reflection covering layer 140 toward the metal 150 for allowing the external contacting of the photovoltaic cell 100.

Analyzing more in detail the elementary cells constituting the whole voltaic cell 100, the lower cell 105a has the base 112 constituted by doped germanium (Ge) of the first type of conductivity—in the considered example, the p type. Alternatively, the base 112 may be implemented by means of appropriately doped silicon (Si). The emitter 114 of the lower cell 105a is formed by the same material of the base 112, for example Ge, but doped in the opposite way—in the considered example, the n type.

The window layer 116 may be constituted by a semiconductor material layer such as a quaternary or ternary compound, for example an indium (In), gallium (Ga) and phosphorous (P) compound, i.e., InGaP, an In, Ga and arsenic (As) compound, i.e., InGaAs, an aluminum (Al), Ga and As compound, i.e., AlGaAs, or by means of a further compound formed by elements of the Groups III and V of the periodic table of the elements.

The tunnel diode 108 may be implemented in a conventional manner, for example by means of a first layer formed by a doped III-V material of the second conductivity type—in the considered example, the n type—and a second layer formed by a doped III-V material of the opposite conductivity type—in the considered example, the p type.

The barrier layer 118 is formed by a semiconductor material, such for example doped AlGaAs, AlGaInP or InGaP of the first conductivity type—in the considered example, of the p type.

The intermediate cell 105b has the base 120 constituted by doped InGaAs of the first conductivity type—in the considered example, the p type. The emitter 124 of the intermediate cell 105b is formed by semiconductor material doped in the opposite manner—in the considered example, of the n type—such as InGaAs, AlInGaAs or AlInGaP. The spacer layer 122 is implemented with semiconductor material, for example the same material as the base 120; however, the material of the spacer layer 122 is intrinsic, i.e., free of an appreciable amount of doping impurities.

The window layer 126 may be constituted by a semiconductor material layer such as AlGaAs, ALInGaP or AlInP, or by a further compound formed by elements of the groups III and V of the periodic table of the elements.

The tunnel diode 110 may be realized by means of a first layer formed by a doped III-V semiconductor material of the second type of conductivity—in the considered example, the n type—and a second layer formed by a doped III-V semiconductor material of the opposite conductivity type—in the considered example, the p type.

In the same way as for the barrier layer 118, the barrier layer 128 is formed by a semiconductor material, such as doped AlGaInP or AlInP of the first conductivity type—in the considered example, the p type.

The higher cell 105c has the base 130 that is constituted by doped InGaP of the first conductivity type—in the considered example, the p type. The emitter 134 of the higher cell 105c is formed by a Group III-V semiconductor material doped in the opposite way—in the considered example, the type n. The spacer layer 132 is realized by means of Group III-V semiconductor material, for example the same material of the base 130; however, the material of the spacer layer 132 is intrinsic, i.e., free of an appreciable amount of doping impurities.

In the same way as for the window layer 126, the window layer 136 may be constituted by a semiconductor material layer such as AlInP; or by means of another compound formed by elements of Groups III and V of the periodic table of elements.

From the manufacturing process point of view, the photovoltaic cell 100 may be manufactured starting from a substrate of the semiconductor material forming the base 112 of the lower cell 105a—in the considered example, Ge—of the proper conductivity type—in the considered example, the p type—and with a proper doping concentration. Particularly, by means of diffusion and deposition processes, starting from such substrate acting as base 112, the emitter 114 of the lower cell 105a is formed. All the subsequent layers of the photovoltaic cell 100 up to the window 136 may be obtained by means of appropriate epitaxial growth techniques, such as Molecular Beam Epitaxy (MBE) or Metal-Organic Chemical Vapor Deposition (MOCVD), using the emitter 114 and the base 112 of the lower cell 105a as a seed substrate.

According to an embodiment, the doping of the base 120 of the intermediate cell 105b is not constant, but instead varies in a non-linear way along its entire depth, i.e. along the direction identified in FIG. 1 with the reference x.

In order to describe in detail the effects produced by the presence of a non-linear doping in the base 120, and illustrate advantages obtainable by the use of such an embodiment, three different doping profiles of the base 120 are now compared to each other.

FIG. 2 illustrates a common conventional case, i.e., the case in which the base 120 is doped with a constant doping concentration. Particularly, with the reference 210a is shown a diagram of the doping concentration $C(x)$ within the barrier 118, the base 120 and the emitter 124 of the intermediate cell 105b along the direction x; the continuous line depicts the concentration of the p type doping—such as zinc (Zn) or carbon (C)—while the concentration of the n type doping—such as for example Si or tellurium (Te)—is depicted by means of the dashed line. It is noted that in FIG. 2 the spacer layer 122 has been deliberately omitted in order not to excessively complicate the description; however, the concepts of this embodiment may be applied both to cells comprising junctions provided with spacer layers made in intrinsic material and to cells comprising junctions without any spacer layer. In the case illustrated in FIG. 2, the p type doping concentration in the base 120 is kept constant along the x direction for the entire depth of the base 120. As known, the p type doping concentration in the base 120 may be set to a value lower than the one of the doping concentration in the barrier 118. With the reference 215a is shown a diagram of the electric field $E(x)$ that develops in the barrier 118, in the base 120, and in the emitter 124 when the doping concentrations follow the profile depicted in the diagram, 210a. As may be observed in the diagram 215a, with a doping profile of this type the electric field is substantially concentrated in two points of the intermediate cell 105b, and particularly in a first point corresponding to the interface between the barrier 118 and the base 120, and in a second point corresponding to the interface between the base 120 and the emitter 124. In greater detail, between the barrier 118 and the base 120 the electric field exhibits a peak—identified in the figure with the reference 220—due to the abrupt variation of the p type doping concentration, while between the base 120 and the emitter 124 the electric field exhibits a further peak—identified in the figure with the reference 225—due to the presence of the depletion region generated by the pn junction base 120/emitter 124. Along the whole central portion of the base 120, the electric field is practically null; as a consequence, the possible hole-electron pairs that are generated by photo generation within such portion of the base 120 would have a very high probability of recombining, subtracting their contribution from the current photo generated by the photovoltaic cell 100.

FIG. 3 illustrates a further conventional case, i.e., a case in which the base 120 is doped with a doping concentration of the p type that linearly varies. Particularly, as illustrated in the diagram 210b, the doping concentration C(x) of the p type in the base 120 linearly decreases from a higher value (at the interface between the barrier 118 and the base 120) to a lower value (at the interface between the base 120 and the emitter 124). With the reference 215b is shown a diagram of the electric field E(x) that develops in the barrier 118, in the base 120, and in the emitter 124 when the doping concentration follows the profile indicated in the diagram 210b. As may be observed in the diagram 215b, with a base 120 provided with a doping profile of the linear type, the electric field is no longer concentrated at the interface between the barrier 118 and the base 120 and at the interface between the base 120 and the emitter 124 only, but extends along the entire depth of the base 120. In greater detail, even in this case the electric field exhibits a first peak—identified in the figure with the reference 230—between the barrier 118 and the base 120 due to the abrupt variation of the doping concentration of the p type and a second peak—identified in the figure with the reference 235—between the base 120 and the emitter 124 due to the presence of the depletion region generated by the pn junction base 120/emitter 124; however, in this case, the presence of a linear doping gradient generates an electric field having a substantially constant value—identified in figure with the reference 240—which extends along the central portion of the base 120, connecting the peak 230 with the peak 235. The presence of a non-null electric field along the entire depth of the base 120 allows the possible hole-electron pairs generated in the central portion of the base 120 to be separated and collected at the terminals of the cell. In order to hinder as much as possible the eventuality that such hole-electron pairs recombine, the doping of the base 120 may be such to provide a sufficiently high electric field along the entire base 120; however, with a linear doping profile of the type illustrated in FIG. 3, this condition may be reached provided that the amount of p type doping is high in a large extent of the base (and therefore, close to the interface with barrier 118, too), as it is highlighted in FIG. 3. As known, excessively doping the semiconductor material of a pn junction reduces the life time of the carriers, increasing the recombination probability; as a consequence, a base 120 provided for a high extent of its thickness of an excessively high doping concentration may reduce the collection of the carriers photo generated in the base 120 portion toward the barrier 118, thus reducing the conversion efficiency of the photovoltaic cell 100.

Figure 4:
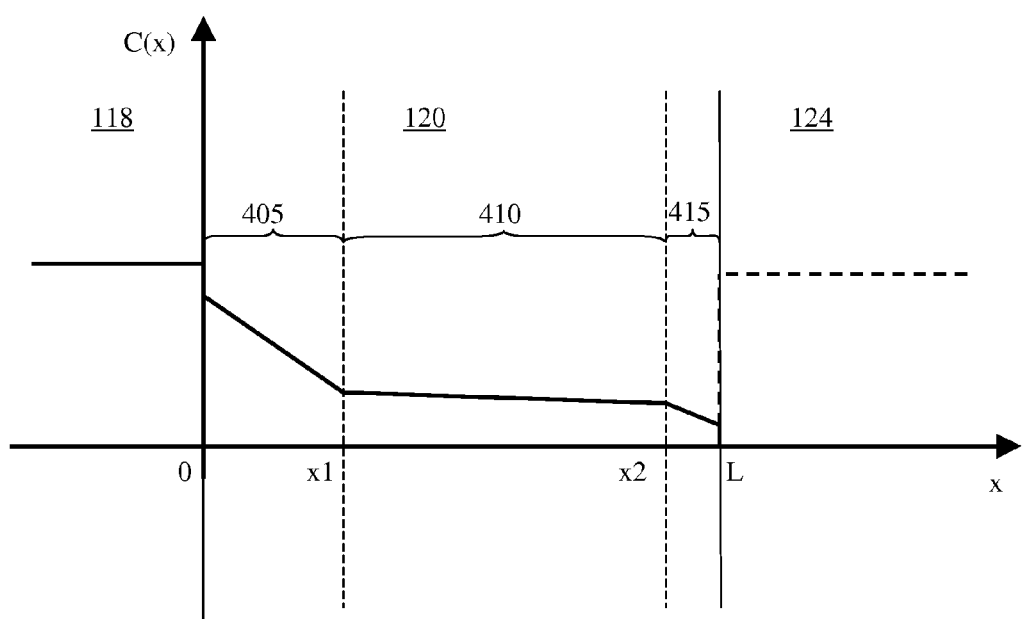
FIG. 4 illustrates the doping profiles of a junction of the cell of FIG. 1 according to an embodiment.

According to an embodiment, this drawback is resolved by properly shaping the p type doping concentration profile C(x) of the base 120 as illustrated in FIG. 4.

Particularly, by setting the origin 0 of the x axis at the interface between the barrier 118 and the base 120, and assuming that the depth of the base is equal to L (i.e., the interface between the base 120 and the emitter 124 occurs at x=L), according to an embodiment, the doping concentration profile C(x) of the base 120 is a decreasing function subdivided into three main portions, and specifically:

- a first portion, identified in the figure with the reference 405 and ranging from x=0 to x=x1, wherein the average value of the slope of the doping concentration profile C(x) is approximately comprised within the approximate range $[-9*10^{17}; -4*10^{17}]$ cm$^{-3}$/µm, and $1/5*L \leq x1 \leq 1/3*L$ approximately;
- a second portion, identified in figure with the reference 410 and ranging from x=x1 to x=x2, wherein the average value of the slope of the doping concentration profile C(x) is approximately comprised within the approximate range $[-2*10^{17}; -5*10^{16}]$ cm$^{-3}$/µm, and $1/3*L \leq x2 \leq 9/10*L$ approximately, and
- a third portion, identified in figure with the reference 415 and ranging from x=x2 to x=L, wherein the average value of the slope of the doping concentration profile C(x) is approximately comprised within the approximate range $[-3*10^{17}; -9*10^{16}]$ cm$^{-3}$/µm.

According to an embodiment, the doping concentration at the interface between the barrier 118 and the base 120 (x=0) ranges from approximately $5*10^{16}$ cm$^{-3}$ to $5*10^{16}$ cm$^{-3}$, and the doping concentration at the interface between the base 120 and the emitter 124 (x=L) ranges from approximately $5*10^{15}$ cm$^{-3}$ to $5*10^{17}$ cm$^{-3}$.

This peculiar doping concentration profile C(x) of the base 120 may be expediently obtained during the manufacturing process of the photovoltaic cell 100 since, as already described in the foregoing, the intermediate cell 105b and, in the example considered, also the higher cell 105c are formed by epitaxial doped semiconductor materials, i.e. by semiconductor material, generated through epitaxial growth techniques, such as MBE or MOCVD. Thanks to the epitaxial growth techniques, the doping of the base layer of the intermediate cell (and, possibly, of the higher cells as well) may be finely controlled all over the base thickness; by exploiting such epitaxial techniques, the dopant elements are introduced into the reaction chamber with Group III-V precursors, allowing to control the doping concentration at an atomic level so as to obtain theoretically any possible doping concentration profile. Conversely, by employing a doping implantation and diffusion technique, such as in the standard silicon solar cells, it may only be possible to obtain doping concentration profiles having the shape of an exponential function—or of a combination of several exponential functions.

Although the doping concentration profile C(x) depicted in FIG. 4 is a piecewise linear function formed by exactly three linear ramps, i.e., one linear ramp per portion, the general concept may be applied to different profiles that may comply with the above-mentioned slope ranges. For example, the doping concentration profile C(x) may be a piecewise linear function including more than three linear ramps or a polynomial function at least of the fourth degree.

An example of a possible doping concentration profile C(x) complying with the slope ranges according to the previously described embodiment is illustrated in FIG. 5 in the diagram 510. Thanks to its peculiar doping profile, the electric field E(x) has a relatively high value at the peripheral portion of the base 120'—i.e., close to the interface between the barrier 118 and the base 120—and a relatively low value at the pn junction—i.e., close to the interface between the base 120 and the emitter 124. Particularly, as illustrated in the diagram 515 of FIG. 5, in this case as well the electric field exhibits a first peak—identified in figure with the reference 550—between the base 120 and the emitter 124. Moreover, even in this case there is an electric field that extends along the central portion of the base 120, connecting the peak 545 with the peak 550. However, the presence of a non linear doping gradient causes the electric field that extends in the central portion of the base—identified in figure with the reference 555—to no longer have a constant value, but instead to have a decreasing trend (in absolute value) along the x direction, from a first value at the interface between the barrier 118 and the base 120 to a second value at the interface between the base 120 and the emitter 124, where said first value is higher—in absolute value—than the second value. The presence of an electric field of this type allows to obtain higher conversion efficiencies, because:

the minority carriers generated in the base 120 portions far from the pn junction are subjected to a higher electric field—generated thanks to the relatively high slope of the doping profile portion 405—and thus are collected in a more efficient way, the diffusion motion of the majority carriers photo generated in the base 120 (i.e., the holes) toward the junction is hindered—thanks to the relatively low slope of the doping profile portion 410—diminishing thus the diffusive component of the dark current of the cell, the minority carriers photo generated in the base 120 (i.e., the electrons) are pushed toward the pn junction—thanks to the electrical field generated by the relatively high slope of the doping profile portion 410, and all the above mentioned advantages are obtained with a relatively low doped base for the majority of its thickness and consequently the recombination probability of the photo generated carriers is limited in a positive manner.

Naturally, in order to satisfy local and specific requirements, one may apply to the embodiments described above many modifications and alterations. Particularly, although embodiments have been described with a certain degree of particularity, it should be understood that various omissions, substitutions and changes in the form and details as well as other embodiments are possible; moreover, it is expressly intended that specific elements and/or method steps described in connection with any disclosed embodiment may be incorporated in any other embodiment as a general matter of design choice.

For example, although, in an embodiment, reference has been made to a three-junction photovoltaic cell, wherein the base that is doped in a non linear way belongs to the intermediate elementary cell, similar considerations apply to different cases, for example in case the number of elementary cells is different than three (even in the case of single-junction cell), in case the base that is doped in a non linear way belongs to an elementary cell different from the intermediate cell, and in the case wherein more than one elementary cell is provided with a base doped in a non linear way.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A monolithic photovoltaic cell comprising at least one junction, wherein said at least one junction includes a base formed by an epitaxial doped semiconductor material of a first conductivity type and an emitter formed by a doped semiconductor material of a second conductivity type opposed to the first conductivity type, said emitter being stacked on the base of said at least one junction according to a first direction (x), and the base of said at least one junction having a decreasing dopant concentration gradient along said first direction, wherein said base of said at least one junction comprises:

a first portion far from the emitter, a second portion proximate to the emitter, and a third portion between the first portion and the second portion, wherein:

in the first portion, said decreasing dopant concentration gradient has a slope whose average value ranges from $-9*10^{17}$ cm$^{-3}$/µm to $-4*10^{17}$ cm$^{-3}$/µm;

in the second portion, said decreasing dopant concentration gradient has a slope whose average value ranges from $-3*10^{17}$ cm$^{-3}$/µm to $-9*10^{16}$ cm$^{-3}$/µm, in the third portion, said decreasing dopant concentration gradient has a slope whose average value ranges from $-2*10^{17}$ cm$^{-3}$/µm to $-5*10^{16}$ cm$^{-3}$/µm, and a magnitude of said decreasing dopant concentration gradient in the third portion is less than a magnitude of said decreasing dopant concentration gradient in the first portion and is less than a magnitude of said decreasing dopant concentration gradient in the second portion.

2. The photovoltaic cell of claim 1, wherein:

a length of the base along the first direction is equal to a first amount, said first portion extending along the first direction from a first end corresponding to an end of the base far from the emitter to a second end, said third portion extending along the first direction from the second end to a third end, said second portion extending along the first direction from the third end to a fourth end corresponding to an end of the base proximate to the emitter;

the second end is located at a first distance from the first end, and the third end is located at a second distance from the first end along the first distance, and said first distance has a value ranging from one fifth to one third of the first amount, and said second distance has a value ranging from one third of the first amount to nine tenth of the first amount.

3. The photovoltaic cell of claim 1, wherein said decreasing dopant concentration gradient corresponds to a piecewise linear function.

4. The photovoltaic cell of claim 3, wherein said piecewise linear function comprises at least three linear ramps, each portion of the base corresponding to at least one respective linear ramp.

5. The photovoltaic cell of claim 1, wherein said decreasing dopant concentration gradient corresponds to a polynomial function.

6. The photovoltaic cell of claim 5, wherein said polynomial function is a polynomial function of at least the fourth degree.

7. The photovoltaic cell according to claim 1, wherein:

the at least one junction includes a first junction, a second junction and a third junction, said second junction being stacked on the first junction according to the first direction and said third junction being stacked on the second junction according to the first direction, and said at least one junction is the second junction.

8. Photovoltaic cell according to claim 2, wherein:

the at least one junction includes a first junction, a second junction and a third junction, said second junction being stacked on the first junction according to the first direction and said third junction being stacked on the second junction according to the first direction, said at least one junction is the second junction, and wherein the dopant concentration at the first end is equal to a first value comprised within $5*10^{16}$ cm$^{-3}$ and $5*10^{18}$ cm$^{-3}$ and the dopant concentration at the fourth end is equal to a second value comprised within $5*10^{15}$ cm$^{-3}$ and $5*10^{17}$ cm$^{-3}$.

9. A method for manufacturing a photovoltaic cell comprising at least one junction, the method comprising:

generating said at least one junction epitaxially forming a base by means of a doped semiconductor material of a first conductivity type and forming an emitter by means of a doped semiconductor material of a second conductivity type opposite to the first conductivity type, said emitter being stacked on the base according to a first direction, the step of forming the base of at least one of said at least one junction includes doping the semiconductor material with a decreasing dopant concentration gradient along said first direction, wherein said step of doping includes:

doping a first portion of the base far from the emitter with a decreasing dopant concentration gradient having a slope whose average value substantially ranges from $-9*10^{17}$ cm$^{-3}$/μm to $-4*10^{17}$ cm$^{-3}$/μm, doping a second portion of the base proximate to the emitter with a decreasing dopant concentration gradient having a slope whose average value substantially ranges from $-3*10^{17}$ cm$^{-3}$/μm to $-9*10^{16}$ cm$^{-3}$/μm, doping a third portion of the base between the first portion and the second portion with a decreasing dopant concentration gradient having a slope whose average value substantially ranges from $-2*10^{17}$ cm$^{-3}$/μm to $-5*10^{16}$ cm$^{-3}$/μm, and doping the first, second, and third portions of the base such that a magnitude of the decreasing dopant concentration gradient of the third portion is less than a magnitude of the decreasing dopant concentration gradient of the first portion and is less than a magnitude of the decreasing dopant concentration gradient of the second portion.

* * * * *